(12) United States Patent
Dotter, II et al.

(10) Patent No.: US 6,463,874 B1
(45) Date of Patent: Oct. 15, 2002

(54) APPARATUS FOR THE SIMULTANEOUS DEPOSITION BY PHYSICAL VAPOR DEPOSITION AND CHEMICAL VAPOR DEPOSITION AND METHOD THEREFOR

(75) Inventors: Buddie R. Dotter, II, Sterling Heights; Joachim Doehler, White Lake; Timothy Ellison, Rochester Hills; Masatsugo Izu, Bloomfield Hills; Herbert C. Ovshinsky, Oak Park, all of MI (US)

(73) Assignee: Energy Conversion Devices, Inc., Troy, MI (US)

( * ) Notice: Subject to any disclaimer, the term of this patent is extended or adjusted under 35 U.S.C. 154(b) by 0 days.

(21) Appl. No.: 09/637,945

(22) Filed: Aug. 11, 2000

Related U.S. Application Data

(62) Division of application No. 09/262,515, filed on Mar. 4, 1999, now Pat. No. 6,186,090.

(51) Int. Cl.$^7$ .............................. C23C 16/00; H05H 1/00
(52) U.S. Cl. ................................ 118/723 MW; 156/345
(58) Field of Search .......................... 118/710, 723 MW, 118/718, 716, 720, 729; 156/345; 427/569, 575, 585

(56) References Cited

U.S. PATENT DOCUMENTS

| | | | |
|---|---|---|---|
| 4,393,091 A | * | 7/1983 | Shinohara et al. ............ 427/13 |
| 4,763,601 A | | 8/1988 | Saida et al. |
| 4,894,584 A | | 1/1990 | Doehler et al. |
| 5,207,885 A | | 5/1993 | Seiler |
| 5,514,217 A | | 5/1996 | Niino et al. |

\* cited by examiner

Primary Examiner—Gregory Mills
Assistant Examiner—P. Hassanzadeh
(74) Attorney, Agent, or Firm—Dean B. Watson

(57) ABSTRACT

Apparatus and method for the vacuum deposition of at least two different layers of thin film material onto a substrate by two different vacuum deposition processes. Also disclosed is a novel linear applicator for using microwave enhanced CVD to uniformly deposit a thin film of material over an elongated substrate.

10 Claims, 7 Drawing Sheets

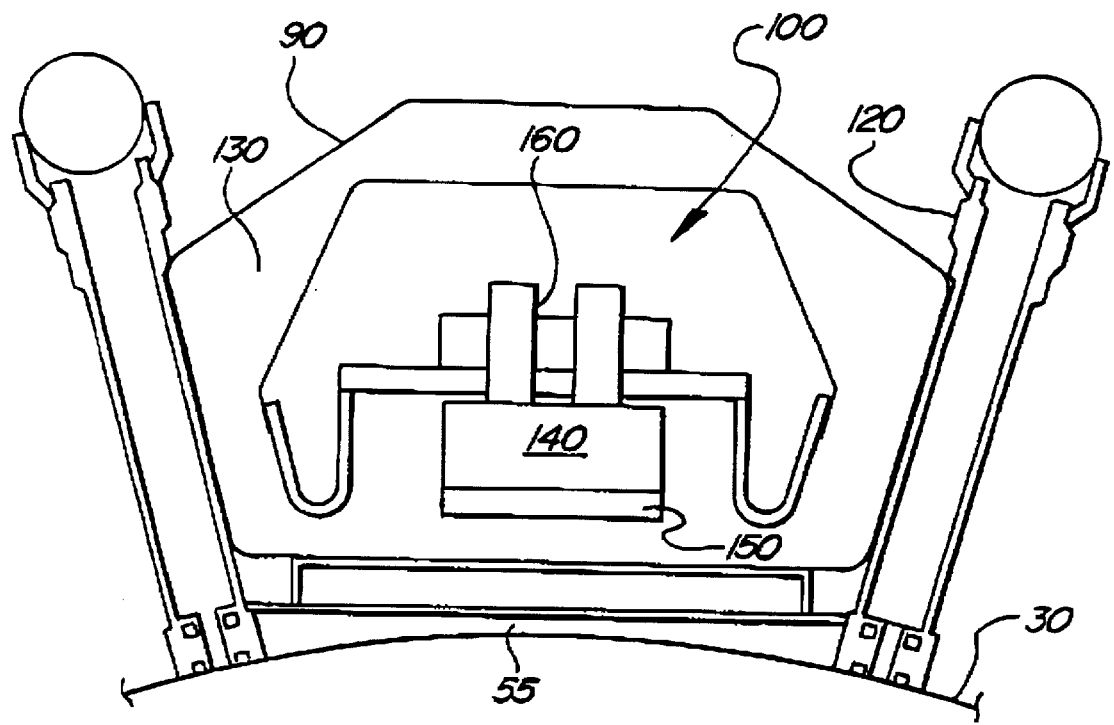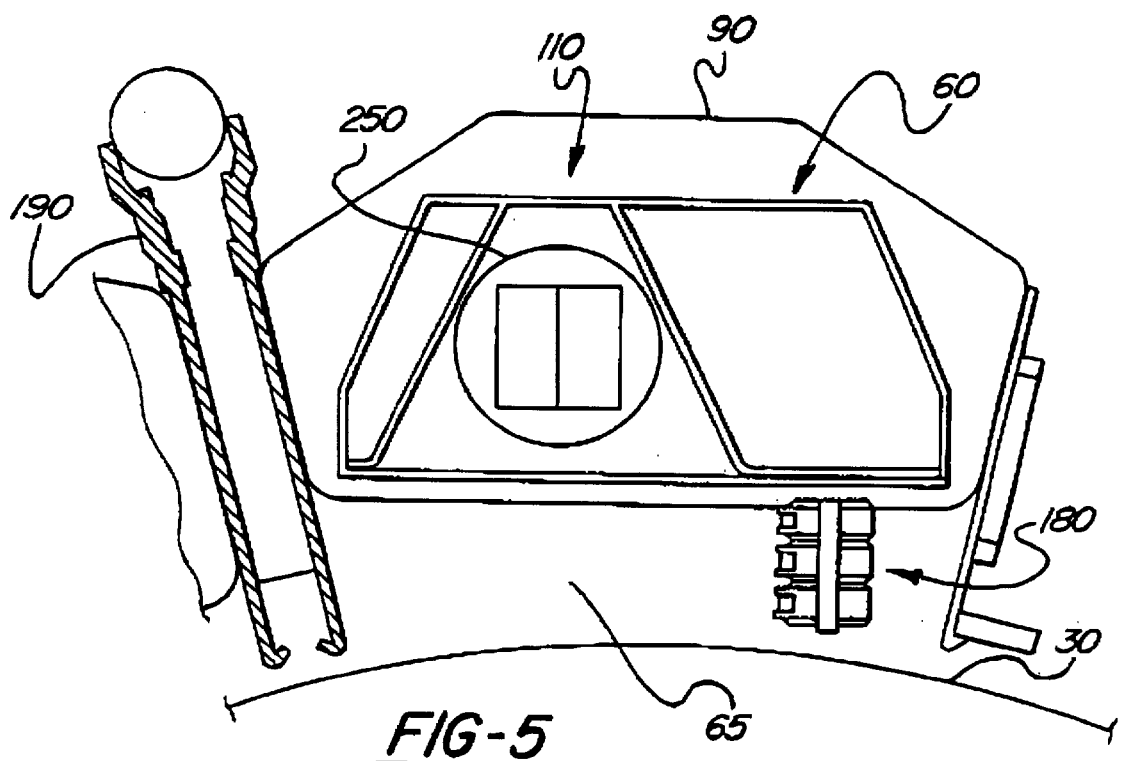

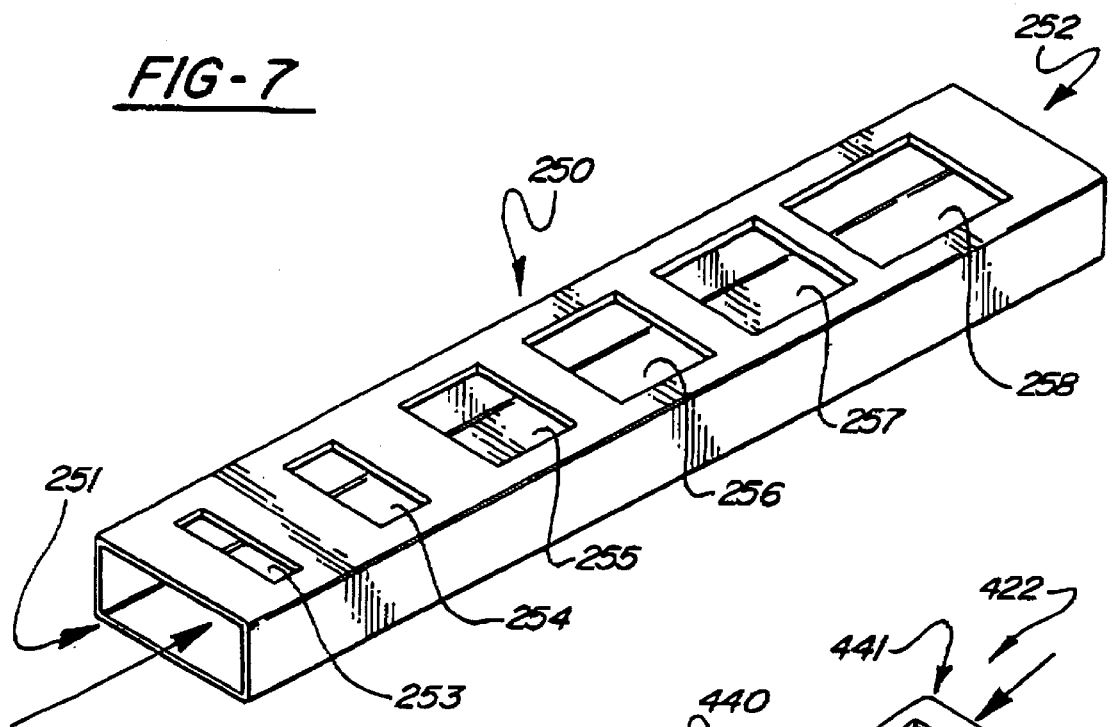
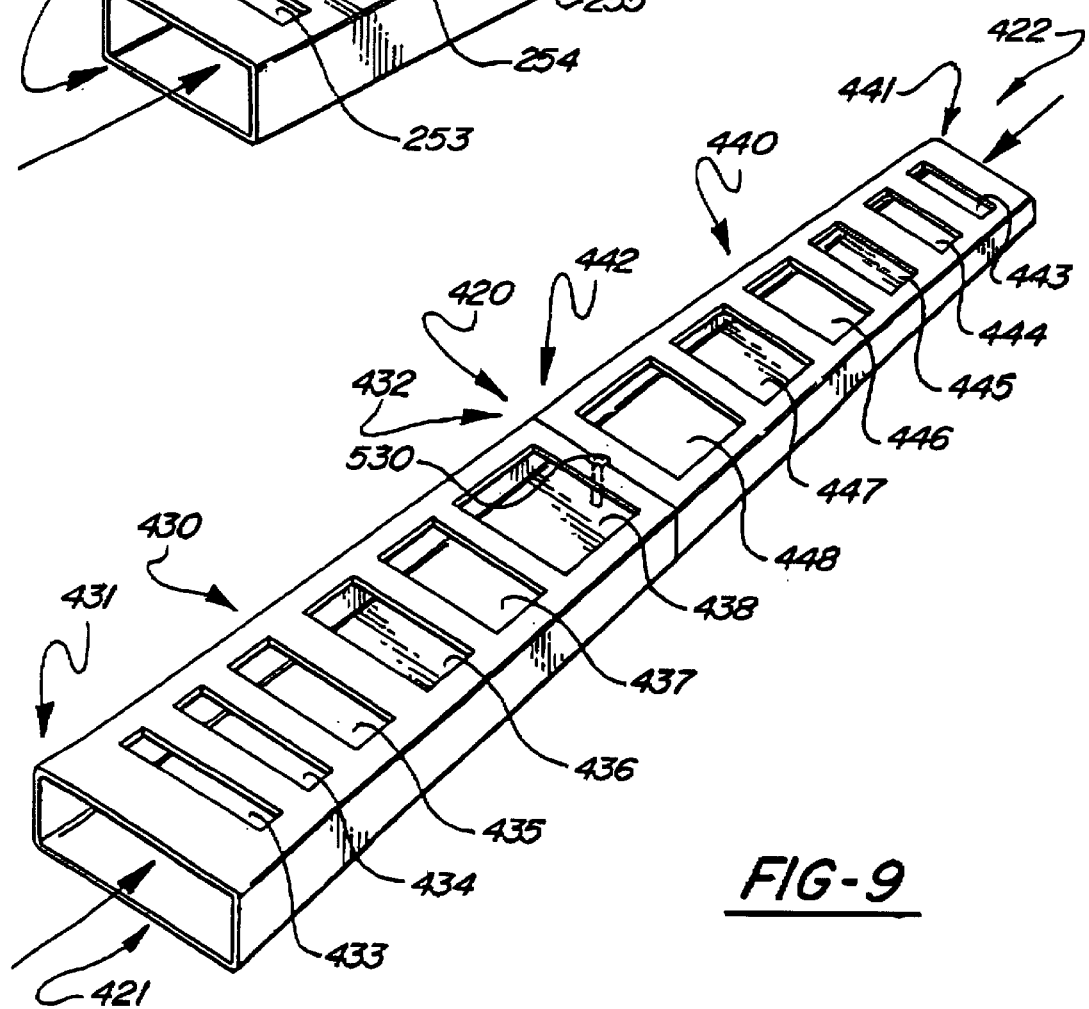

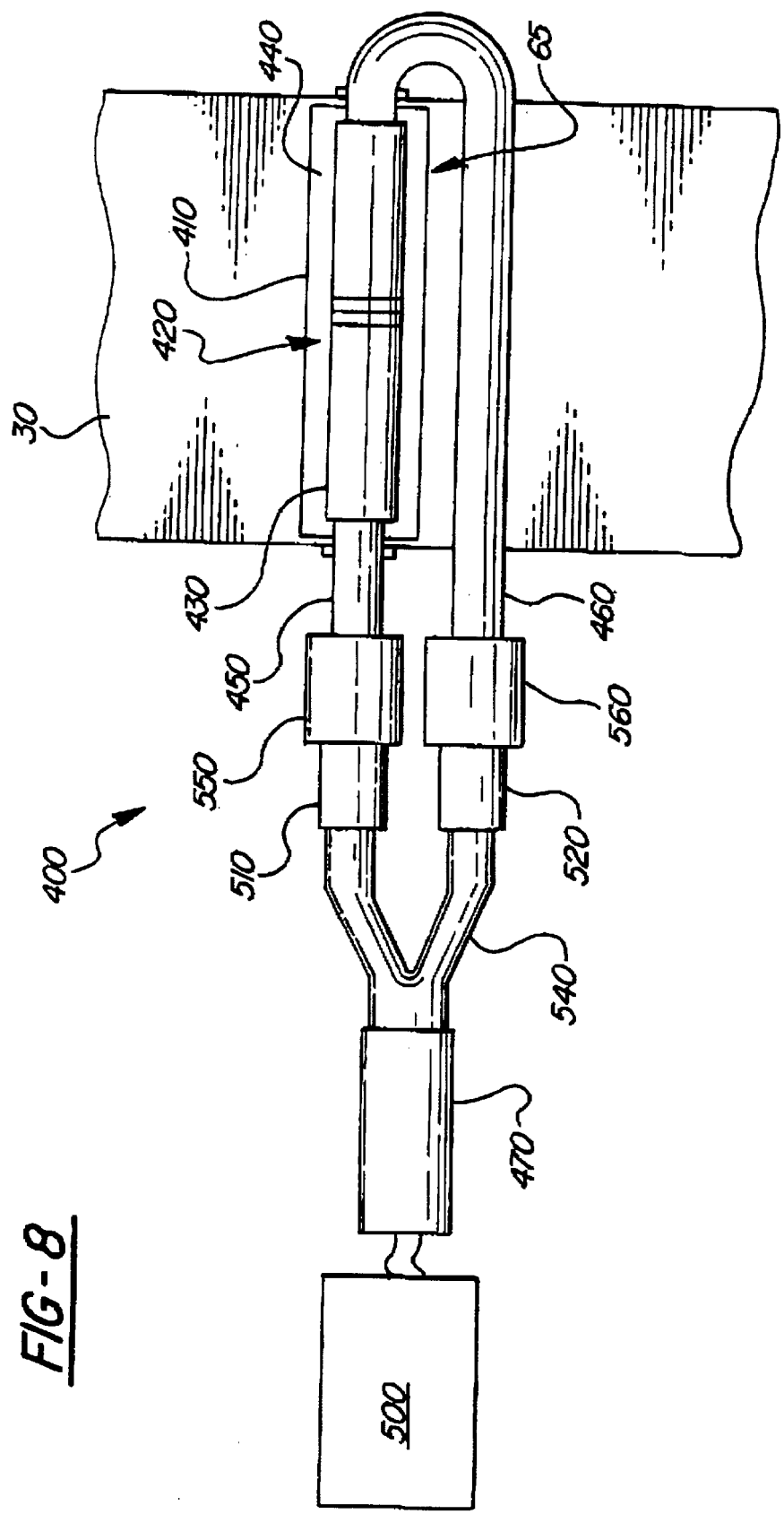

APPARATUS FOR THE SIMULTANEOUS DEPOSITION BY PHYSICAL VAPOR DEPOSITION AND CHEMICAL VAPOR DEPOSITION AND METHOD THEREFOR

REFERENCE TO RELATED APPLICATIONS

The present application is a divisional of U.S. pat. application Ser. No. 09/262,515, entitled "Apparatus For The Simultaneous Deposition By Physical Vapor Deposition And Chemical Vapor Deposition And Method Therefor " by Dotter et al., filed Mar. 4, 1999, which is now issued U.S. Pat. No. 6,186,090 B1, the disclosure of which is hereby incorporated by reference.

FIELD OF THE INVENTION

This invention relates generally to apparatus for the simultaneous physical vapor deposition ("PVD") and chemical vapor deposition ("CVD") of thin film material onto a substrate, and more particularly, to a novel apparatus for the simultaneous sputtering and microwave chemical vapor deposition of thin film material onto a substrate, most preferably an elongated web of substrate material.

BACKGROUND OF THE INVENTION

A variety of products may be fabricated by thin film processes. Examples of the products that may be fabricated by the deposition of thin film materials include interferometer stacks for optical control and solar control. An example of a solar control product is disclosed in U.S. Pat. No. 5,494,743 to Woodard, et al entitled "ANTIREFLECTION COATINGS", the disclosure of which is incorporated herein by reference. More specifically, Woodard, et al disclose a polymeric substrate having antireflective coatings disposed thereon. The anti-reflective coatings consist of one or more inorganic metal compounds with indices of refraction higher than that of the polymeric substrate.

Thin film materials that are used for optical control an generally comprised of a series of layers of metals and dielectrics of varying dielectric constants and indices of refraction. These thin film materials may be used, for example, to reduce glare or reflection. Thin film materials may also be used as solar control films for low emission of infrared radiation in order to reduce the loss of heat.

In the manufacture of thin film materials for optical control, many interferometer stacks will have a top layer of silicon dioxide. An antireflective layer for a single layer of material having an index of refraction greater than 1.00 will have an index of refraction equal to the square root of the index of refraction of the single layer material. The thickness of the material calculated at the center wavelength of the frequency band at issue, more precisely, the optical thickness is ¼ of the wavelength at the center frequency. For example, the human eye generally sees light having a wavelength between 4000 Å and 7000 Å Therefore, the thickness of the optical coating for anti-reflection at 5500 Å is about 1375 Å Optical properties including the index of refraction and transparency as well as with the mechanical properties of silicon dioxide make it the material of choice for anti-reflective coatings.

A number of processes are currently utilized to deposit thin film materials, some of which are described in *Thin Film Processes*. John L. Vossen and Warner Kern, eds., Academic Press, Inc., New York, N.Y., 1978. The fundamentals of chemical vapor deposition are disclosed in Chapter III-2 of Thin Film Processes by Warner Kern and Vladimir S. Ban. Chemical vapor deposition, CVD, as a method of forming and depositing material causes the constituents of a gas or vapor phase of a material to form a product which is deposited on some surface. Therefore, the chemical reaction may be either endothermic or exothermic.

The reactants of a CVD process are the logical result of the stack design and are determined by the precursor materials. For example, if silicon dioxide ($SiO_2$) is desired to be deposited, silane ($SiH_4$) may be oxidized by oxygen ($O_2$) to yield silicon dioxide as the desired product and a by-product of hydrogen ($H_2$). Alternatively, silane may be decomposed to deposit an amorphous silicon alloy material on a substrate. For example, products may be formed by energizing the reactants to a reaction temperature. The reaction temperature may be achieved by any suitable method known in the art including R.F. glow discharge and electrical resistive heating. A CVD reaction may occur in a wide range of pressures from above an atmosphere to a less than a millitorr.

Low pressure CVD processes offer substantial advantages over CVD processes operating at about atmospheric pressure. The diffusity of a gas and the mean free path of gas molecules is inversely related to pressure. As the pressure is lowered from about atmospheric pressure to 1 torr, the effect is an increase of approximately 2 orders of magnitude in the diffusion constant. Commonly assigned, U.S. Pat. Nos. 4,517,223 and 4,504,518 to Ovshinsky, et al both entitled "METHOD OF MAKING AMORPHOUS SEMICONDUCTOR ALLOYS AND DEVICES USING MICROWAVE ENERGY", the disclosures of which are incorporated herein by reference, described processes for the deposition of thin films onto a small area substrate in a low pressure, microwave glow discharge plasma. As specifically noted in these patents, operation in low pressure regimes not only eliminates powder and polymeric formations in the plasma, but also provide the most economic mode of plasma deposition.

A low pressure microwave initiated plasma process for depositing a photoconductive semiconductor thin film on a large area cylindrical substrate using a pair of radiative waveguide applicators in a high power process is disclosed in commonly assigned, U.S. Pat. No. 4,729,341 to Fournier, et al for "METHOD AND APPARATUS FOR MAKING ELECTROPHOTOGRAPHIC DEVICES", the disclosure of which is incorporated herein by reference. However, the principles of large area deposition described in the '341 patent are limited to cylindrically shaped substrates and the teachings provided therein are not directly transferable to an elongated web of substrate material.

The use of a microwave radiating applicator has been extended to chemical vapor deposition onto an elongated web of substrate material in commonly assigned U.S. Pat. No. 4,893,584 to Doehler, et al for "LARGE AREA MICROWAVE PLASMA APPARATUS", the disclosure of which is incorporated herein by reference. By optimizing the isolating window to withstand compressive forces, the thickness of the window may be minimized to provide for rapid thermal cooling, whereby the '584 patent achieves a high power density without cracking the window. Furthermore, by maintaining the apparatus of the '584 patent at subatmospheric pressures, it is possible to operate the apparatus at a pressure approximating that required for operation near the minimum of a modified Paschen curve. As disclosed in commonly assigned U.S. Pat. No. 4,504,518, a Paschen curve is the voltage needed to sustain a plasma at each pressure. A modified Paschen curve is related to the power required to sustain a plasma at each pressure. The normal operating range is dictated by the minimum of the curve. Additionally, the low pressures allow for a longer mean free path of travel for the plasma species, thereby contributing to overall plasma uniformity.

In a CVD process, a sufficient proportion of feedstock gases are provided to achieve a correct stoichiometric deposition of materials. An excellent method for chemical vapor deposition is disclosed in commonly assigned U.S. Pat. No. 5,411,591 to Izu, Dotter, Ovshinsky, and Hasegawa entitled "APPARATUS FOR THE SIMULTANEOUS MICROWAVE DEPOSITION OF THIN FILMS IN MULTIPLE DISCRETE ZONES", the disclosure of which is incorporated by reference herein, Izu, et al disclose an apparatus for the microwave plasma enhanced chemical vapor deposition of thin film material onto a web of substrate material utilizing a linear microwave applicator. By maintaining the plasma region at subatmospheric pressures, a longer mean free path of travel for the plasma species is available, which contributes to the overall plasma uniformity.

In order to maintain a uniform plasma over a much wider substrate, about 1 meter or wider, spacing between the windows must be decreased. As the spacing between the windows of the linear applicator decrease, the potential for shorting increases. It is not possible to maintain a plasma if the linear applicator is prone to shorting. One advantage of a CVD process is the film deposition rate. The product formation rate in a CVD apparatus is related to the flow rate of the feedstock gases. As the rate of product formation increases, the deposition rate also increases. So long as enough energy is provided to react the feedstock gases, the deposition rate is limited by the rate at which non-deposited species may be evacuated from the CVD apparatus. Although a CVD process works well for many thin film materials, there are many materials which are desired and cannot be deposited by any known CVD process, such as indium tin oxide, ITO.

Another known method of depositing thin film material is a PVD (Physical Vapor Deposition) process. There are a number of PVD processes known in the art of thin film material deposition, many of which are disclosed in *THIN FILM PROCESSES*. J. L. Vossen and W. Kern, eds., Ch. II, Academic Press, New York, N.Y. 1978.

A common PVD process is sputtering which deposits fine particles from a source material. Although the nomenclature is unintuitive, the source of the material to be deposited upon the substrate is called the target. The term "target" evolves from the process of bombarding the source material with a charged noble gas. The target is affixed to a cathode which is a plate having a negative electrical bias. The target faces the substrate material which may be grounded, floating, biased, heated, cooled or some combination thereof. An inert reaction gas, typically argon, is introduced and ionized to provide a medium for transporting an electrical charge. The reaction gas may be ionized by a number of methods including an anode plate, a positively biased inlet port or by biasing the substrate itself. The positively charged reaction gas ion is repelled from the positively charged source and is electrically attracted to the target plate where the positively charged ion strikes the target and removes target atoms by momentum transfer. The removed atoms travel toward the substrate where they condense into thin films.

Although a sputtering process generally does not consume gas for purposes of thin film deposition, it is desirable to flow an inert gas. Flowing the inert gas provides for the removal of impurities which may otherwise accumulate within the chamber. When flowing the inert gas, a pumping scheme should be employed in order to maintain the pressure within the sputtering chamber. It is important to maintain an isobaric condition in the vicinity of the sputtering targets. A pressure gradient will result in a nonuniform bombardment of the sputtering target and consequently non-uniform film deposition. Generally, the chamber pressure for sputtering processes is 75 millitorr or lower. Low pressure sputtering, where the sputtering chamber pressure is about 10 millitorr or less, provides reaction gas ionization far away from the cathode where the chance of the electrical charge being lost to the chamber walls is greatly increased. Therefore, ionization efficiencies are low and self-sustained discharges cannot be maintained in a planar sputtering process.

Reactive sputtering, a method that may be used to form oxides for example, is conducted at a very low pressure, about 5 mtorr or less. The goal in reactive sputtering is to increase the amount of gas phase chemistry, which will increase the probability of collisions, which may be achieved by raising the pressure. However, if $SiO_2$ is to be deposited by DC sputtering for example, a silicon target is used in an atmosphere containing oxygen. However, oxygen will react with the silicon target material, forming $SiO_2$, which is an insulator. A DC current cannot be maintained in the present example once the silicon target is oxidized; the charged particle will not have an electrical field to move through.

By the addition of a magnetic field to a sputtering process, sputtering can be maintained at a pressure below 10 millitorr. The mean free path of a charged particle is increased by the addition of the magnetic field. By applying a magnetic field perpendicular to an electric field, the path of the electron is influenced and becomes perpendicular to both the magnetic field and the electrical field. A planar magnetron sputtering device, for example, having a plurality of permanent magnets which are disposed parallel to one another and oriented with alternating polarity on one plane, creates a circular or oval electron path. With the addition of an electrical field, the charged particle takes on a helical path.

The helical path of a charged particle has two advantages: first, the charged particle is prevented from contacting the chamber walls by the presence of the magnetic field, thereby increasing low pressure efficiency; and second, by increasing the length of the traveled path, the potential for collision with other particles has increased.

Although sputtering is a common and well-refined practice, it does have some disadvantages. One of the disadvantages associated with sputtering is the rate of deposition. For example, silicon dioxide can be deposited by both magnetron sputtering and microwave plasma enhanced chemical vapor deposition. The deposition rate of silicon dioxide for pulsed magnetron sputtering is 10–20 Å per second while silicon dioxide deposited by microwave plasma enhanced chemical vapor deposition is deposited at a rate of 100–200 Å per second, an order of magnitude improvement. However, as noted above, there are materials, such as ITO, for which there are no known methods for deposition by chemical vapor deposition.

Thin film materials for the manufacturer of interferometer stacks for optical and thermal control generally consist of multiple layers of materials having a determined thickness layered upon a substrate. The materials and their associated thickness' are collectively referred to as a "stack." A stack is designed to achieve a particular purpose, whether that purpose be optical control, solar control or any other design objectives sought to be achieved. As mentioned above, many optical and solar control stacks have a relatively thick, about 1000 Å, top layer of $SiO_x$. If a stack requires at least one layer to be sputtered, then one of two alternatives is available, under the current state of the art, to produce the top layer of $SiO_x$. The first alternative is to sputter the entire stack. However, because of the sputtering deposition rate of $SiO_x$ and the required material thickness of $SiO_x$ for the top layer of the stack, a substantially long process time is required to manufacture the stack. Alternatively, all layers except for the top layer of $SiO_x$ may be manufactured by PVD and then the entire roll of sputtered substrate material is transported to a machine for CVD of the 1000 Å layer of $SiO_x$. Although both of these approaches create the desired final product, the time required to manufacture the stack is substantially long, resulting in higher production costs and reduced efficiency. Furthermore, if the coating is intended for a wide material, about 1 meter, such as a window for a commercial building, the state of the art does not provide a means for depositing a uniform layer of material by CVD.

Therefore, there exists a need in the art for an apparatus which substantially reduces the amount of time required to manufacture a product consisting of multiple layers of thin film material deposited on a substrate by including a PVD process and CVD process in single machine.

Furthermore, there exists a need in the art for a CVD process that is capable of depositing a uniform layer of material onto a widened substrate.

SUMMARY OF THE INVENTION

There is disclosed herein novel apparatus for the deposition of thin film material upon a substrate. The apparatus comprises a deposition chamber and a pump for evacuating the interior of the chamber. A substrate is operatively disposed within the chamber, and the substrate is movable from a first to at least a second station for the deposition of different layers thereupon. The apparatus further comprises a first means for depositing the first layer of thin film material onto the substrate and a second means for depositing the second layer of thin film material atop the first layer. The first and second means are adapted to deposit the layers by two different deposition processes selected from the group consisting of a PVD process and a CVD process.

The PVD process is selected from the group consisting of D.C. sputtering, D.C. magnetron sputtering, R.F. sputtering, R.F. magnetron sputtering, reactive sputtering, evaporative deposition, reactive evaporative deposition, and plasma arc deposition; and the CVD process is selected from the group consisting of thermal CVD, hot wire CVD, PECVD, MPECVD, DCPECVD, RFPECVD, WMPECVD, and ECR (electron cyclotron resonance). Material provided by each of at least two different deposition processes is confined within a distinct and substantially isolated deposition region. Each deposition region is isolated by a confinement system. The PVD process and CVD process operate at substantially the same pressure. The pressure difference between each of the different processes is no greater than an order of magnitude.

There is also disclosed herein an apparatus for the deposition of thin film material onto a substrate at subatmospheric pressure. The apparatus comprises a deposition chamber, at least one PVD means for depositing thin film material upon a substrate operatively disposed within the deposition chamber within a PVD region; and at least one CVD means for depositing thin film material upon a substrate operatively disposed within the deposition chamber within a CVD region.

A plurality of confinement systems are disposed within the deposition chamber. The PVD region is substantially isolated by at least one of the confinement systems, and a CVD region is substantially isolated by at least another one of the confinement systems is at least partially defined by another one of the confinement systems, whereby non-deposited species from the respective deposition regions are prevented from contaminating adjacent deposition regions.

The PVD means may be a sputtering device disposed within the deposition chamber. The sputtering device comprises a cathode within the deposition chamber and at least one target secured to the cathode. The target consists of material to be deposited onto the substrate. The CVD means may be a microwave plasma enhanced chemical vapor deposition ("MPECVD") device comprising an applicator enclosure and a linear applicator having a first end and a second end. The linear applicator has at least one aperture and is disposed within the applicator enclosure so as to isolate the linear applicator from the deposition chamber. A wave guide communicating with the first end of the linear applicator directs microwave energy from a microwave source communicating with the wave guide. The aperture is adapted to generate a uniform plasma from the microwave energy dispersed within the CVD region of said deposition chamber.

There is also disclosed herein a widened microwave device comprising an applicator enclosure and a widened microwave linear applicator disposed within the applicator enclosure. The widened linear applicator has a first applicator half and a second applicator half, each of the first and second applicator halves having a first end and second end. At least one aperture is disposed within each of said first and second applicator halves. The second end of the first applicator half is communicating with the second end of the second applicator half. A first wave guide is communicating with the first end of the first applicator half, and a second wave guide is communicating with the first end of the second applicator half. A microwave source is communicating with the first and second wave guides, whereby microwave energy produced by the microwave source is guided to the first and second applicator halves. The aperture disposed within each of the first and second applicator halves allowing microwave energy to form a CVD plasma when said device is operatively disposed within an evacuated deposition chamber process gas is introduced therein.

There is also disclosed a method for fabricating an interferometer stack deposited upon a substrate, the stack having at least two layers, each layer formed by a different deposition process selected from the group consisting of a PVD process and a CVD process, comprising the steps of: providing a deposition chamber; evacuating the deposition chamber to sub atmospheric pressure; providing a substrate within the deposition chamber; depositing a first layer of material by a first process selected from a PVD process or a CVD process onto the substrate; and depositing a second layer of material by the other of the PVD process or CVD process atop the first deposited layer of the substrate. The interferometer stack may be a multi-layer selective solar control coating for optical substrates formed from at least one of moisture resistant dielectric materials and semiconductor materials. The dielectric material is one or more compounds selected from the group consisting of silicon nitride, silicon oxide, titanium oxide, silicon oxynitride, alloys of these materials with carbon and diamond-like carbon. The semiconductor material is one or more compounds selected from the group consisting of silicon carbide, silicon, doped silicon, germanium, doped germanium and germanium carbide.

These and other objects and advantages of the present invention will become apparent from the detailed description, the drawings and claims which follow hereinafter.

BRIEF DESCRIPTION OF THE DRAWINGS

FIG. 4 is a schematic view of an embodiment of a RVD device, more specifically, a magnetron sputtering device illustrating the deposition of the reaction gas inlet manifolds;

FIG. 5 is a cross-sectional view of a first embodiment of a CVD device, more specifically, a plasma enhanced chemical vapor deposition device, illustrating the operative elements disposed within the confinement system and including the feed stock gas inlet manifold, feed stock gas exhaust manifold, and linear microwave applicator of the instant invention;

FIG. 7 is an isometric view of an embodiment of a linear microwave applicator;

FIG. 8 is an illustration of a first embodiment of the widened microwave plasma enhanced CVD device; and FIG. 9 is an isometric view of an embodiment of the widened linear microwave applicator of the instant invention.

DETAILED DESCRIPTION OF THE INVENTION

Figure 1:
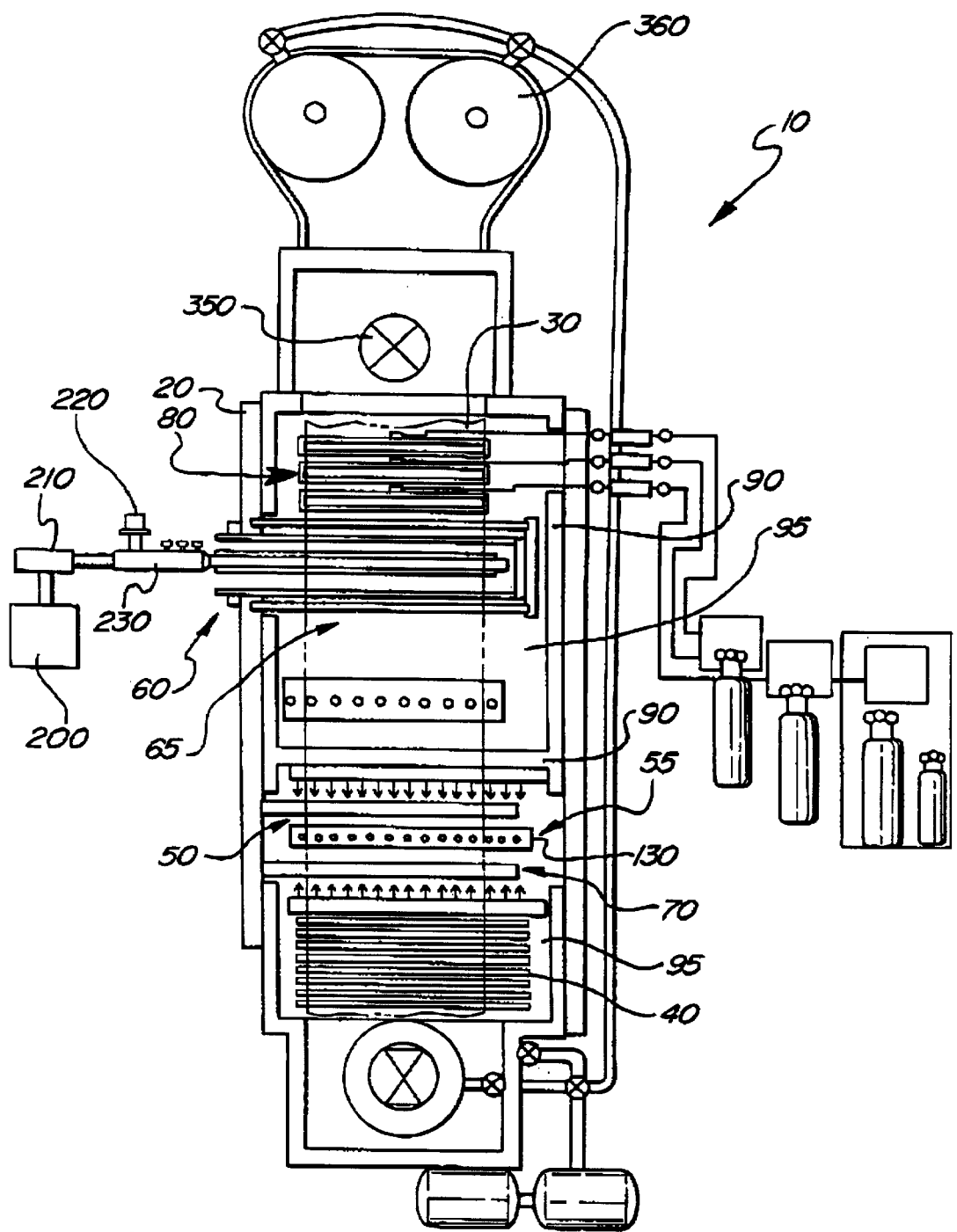
FIG. 1 is a schematic view, partially in cross-section, of a first embodiment of the apparatus according to the teachings of the present invention, the cross-section taken through the vacuum deposition chamber, showing the substrate in phantom in order to reveal the operative elements disposed within the single chamber. This figure illustrates a substrate traveling linearly from a PVD station to a CVD station.

The present invention relates to an apparatus for the simultaneous deposition of thin film material by a Physical Vapor Deposition ("PVD") process and/or a Chemical Vapor Deposition ("CVD") process onto a substrate. Although one skilled in the art would recognize the processes that are included in the groups referred to as a PVD processes and a CVD processes, and not intending to be exhaustive, PVD processes include: D.C. sputtering, D.C. magnetron sputtering, R.F. sputtering, R.F. magnetron sputtering, reactive sputtering, evaporative deposition, reactive evaporative deposition, and plasma arc deposition; and CVD processes include: thermal CVD, hot wire CVD, plasma enhanced chemical vapor deposition ("PECVD"), microwave plasma enhanced chemical vapor deposition ("MPECVD"), D.C. PECVD ("DCPECVD"), R.F. PECVD ("RFPECVD"), widened MPECVD ("VVMPECVD") and electron cyclotron resonance ("ECR").

Pursuant to the subject invention, at least two different processes operate within a single vacuum deposition chamber. The processes may be selected from the PVD group, the CVD group, or any combination thereof. The processes preferably operate at substantially the same operating pressure, generally the pressure difference between each of the different processes is no greater than an order of magnitude. The operation of each of at least two different processes is made possible by substantially confining species formed as a result of each process within a substantially isolated deposition region. The deposition region is that portion of the deposition chamber where material from either a PVD process or CVD process is deposited upon a substrate.

The threat of cross contamination of materials, whether they be excited species, precursor gasses, products of a CVD process or products of a PVD process, cannot be tolerated. By preventing cross contamination, combinations of PVD or CVD processes may be functionally deployed within a single deposition chamber, resulting in increased efficiency and reduced production costs. Cross contamination is prevented by a confinement system. The confinement system may be particle vector confinement, gas gate confinement, or the like, depending on the operating pressure required. Previously, if a stack design called for materials that must have been deposited by at least two different processes that could not be disposed in the same deposition chamber because of cross contamination concerns, the processes would have to be executed separately.

The present invention contemplates a substrate movable from a first of at least two deposition stations to a second deposition station. However, the principles of the present invention may be applied to a stationary substrate operatively disposed adjacent to each of at least two deposition stations. A deposition station is a spatially discrete deposition location where a deposition process is executed.

In the exemplary embodiment, an apparatus is disclosed incorporating a PVD device and a CVD device, where cross contamination is prevented by particle vector confinement. One specific PVD device disclosed is a magnetron sputtering device, and one specific CVD device disclosed is an MPECVD device. It should be noted that any suitable CVD device or process may be substituted for the MPECVD device. Likewise, it should also be note that any suitable PVD device or process may be substituted for magnetron sputtering. The sputtering and microwave plasma enhanced chemical vapor deposition processes occur within an evacuated chamber at subatmospheric pressure. By providing a PECVD and sputtering within the same deposition chamber, the advantages of each process may be harvested with an increased efficiency over the prior art. This exemplary embodiment of the apparatus of the present invention combines the high rate of material deposition provided by PECVD in concert with the variety of materials that may be deposited by sputtering.

Referring now to FIG. 1, a schematic cross-sectional illustration of a first embodiment of apparatus 10 for simultaneous deposition of one or more thin film materials onto a substrate material by a CVD process and PVD process is shown.

The apparatus 10 includes a vacuum deposition chamber 20, the walls of which are preferably formed of a durable, corrosion resistant material such as stainless steel. Disposed within the deposition chamber 20 is a PVD device 50 and a CVD device 60. Material provided by the PVD device 50 is deposited upon a substrate 30 within a PVD deposition region 55. Likewise, material provided by the CVD device 60 is deposited upon the substrate 30 within a CVD deposition region 65. Substrate 30 is disposed within the deposition chamber 20 and is movable from at least a first deposition station 70 to a second deposition station 80 for the deposition of different layers thereon. Although two layers may consist of the same material, if the layers are deposited at discrete locations within the chamber 20, they are different layers for purposes of this invention. Different layers also refers to layers deposited by at least two different means selected from the group consisting of a PVD process and a CVD process. A PVD process or a CVD process may be provided at the first deposition station 70. Likewise, second deposition station 80 may provide either a PVD process or a CVD process. A plurality of confinement chambers 90 are disposed within the deposition chamber 20. Each of the plurality of confinement chambers 90 has at least one aperture 95. Each of the PVD region 55 and the CVD region 65 are isolated by one of a plurality of confinement systems. Each of the PVD device 50 and the CVD device 60 may be disposed within, partially disposed within, or in communication with one of the plurality of confinement chambers 90. The substrate 30 is disposed in close proximity to the aperture 95 of each confinement chamber 90 at least partially defining a PVD region 55 and a CVD region 65, thereby further defining the PVD region 55 and CVD region 65.

One or more glow bars 40 may be disposed within the deposition chamber 20. The addition of one or more glow bars 40 assist in the adherence of thin film materials to the substrate 30. The substrate 30 may be an elongated web of substrate material that is adapted for deposition of thin film materials. A vessel pump-down port 350 is adapted to be in communication with the deposition chamber 20 and is also in communication with a pump farm 360.

Figure 2:
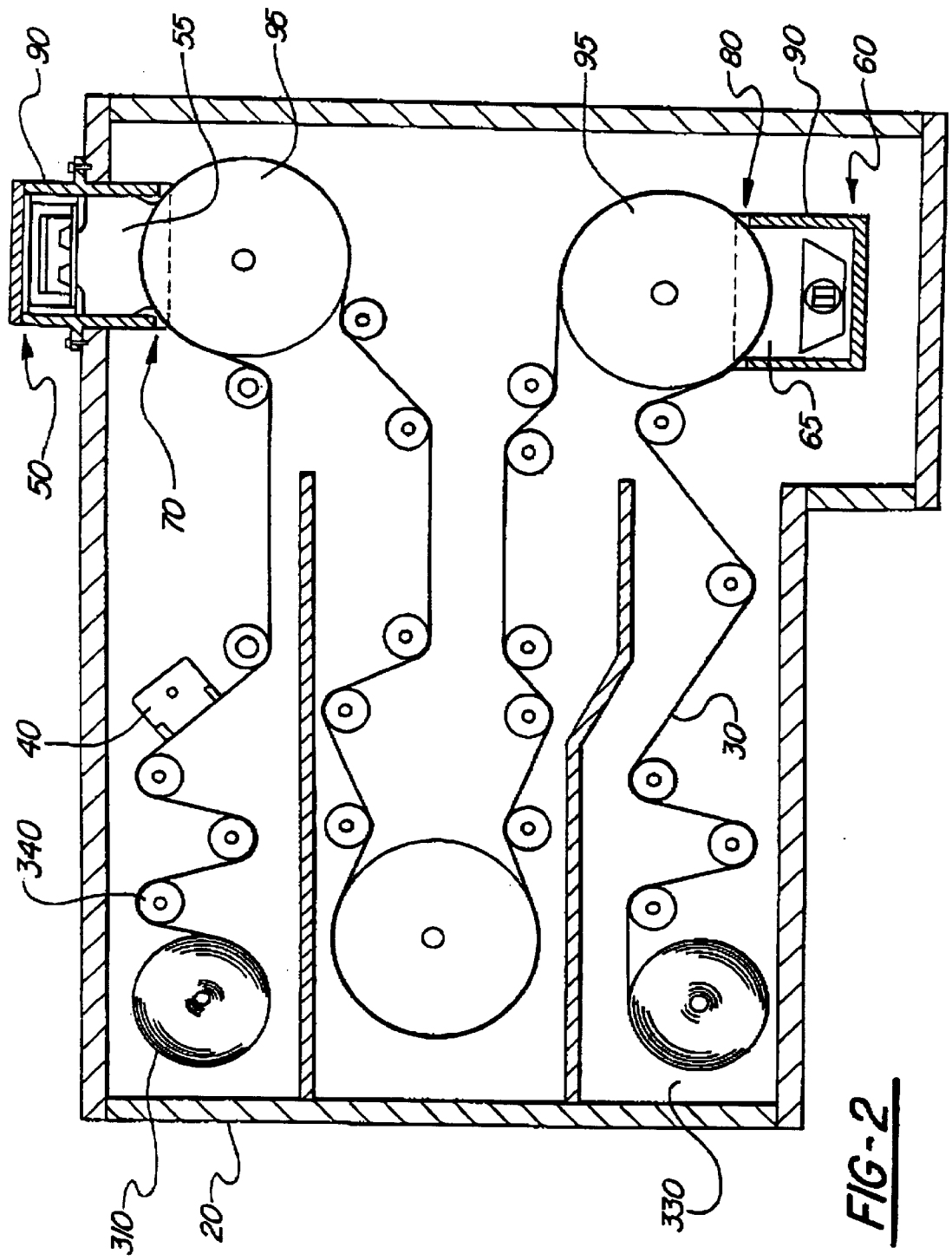
FIG. 2 is a cross-sectional view of a second embodiment of the apparatus according to the teachings of the present invention in which a PVD region and a CVD region are included within a vacuum deposition chamber and the substrate follows a serpentine path through the vacuum deposition chamber.

Referring now to FIG. 2, a schematic cross-sectional view of a second embodiment of the apparatus 10 according to the teachings of the present invention is shown. One or more guide rollers 340 may be employed to direct the substrate 30 within the vacuum deposition chamber 20. In the immediate embodiment of the present invention, a PVD device 50 and CVD device 60 are each isolated by a confinement system, and more specifically, by one of a plurality of confinement chambers 90. Each of a PVD region 55 and CVD region 65 are defined by one of the plurality of confinement chambers 90, each confinement chamber 90 defining either a PVD region 55 or CVD region 65 has an aperture 95 where the substrate 30 subtends each aperture 95.

Although a PVD device 50 precedes a CVD device 60 in the order of deposition as disclosed in the present embodiment of apparatus 10, any combination of a CVD device 60 and/or a PVD device 50 may be employed. The order of deposition within the deposition chamber 20 is governed by the design of the interferometer stack. As an example, if the design of the stack requires that a first layer, the layer closest to the substrate 30, have a composition that is more efficiently deposited by a PVD process, then a PVD device 50 will deposit a layer of material upon the substrate 30. The flexibility of the present invention allows several PVD and/or CVD processes to operate within the deposition chamber 10, in any desired order. Thus, it should become apparent to those skilled in the art that the novel teachings of the present invention provide substantial advantages over the prior art.

Figure 3:
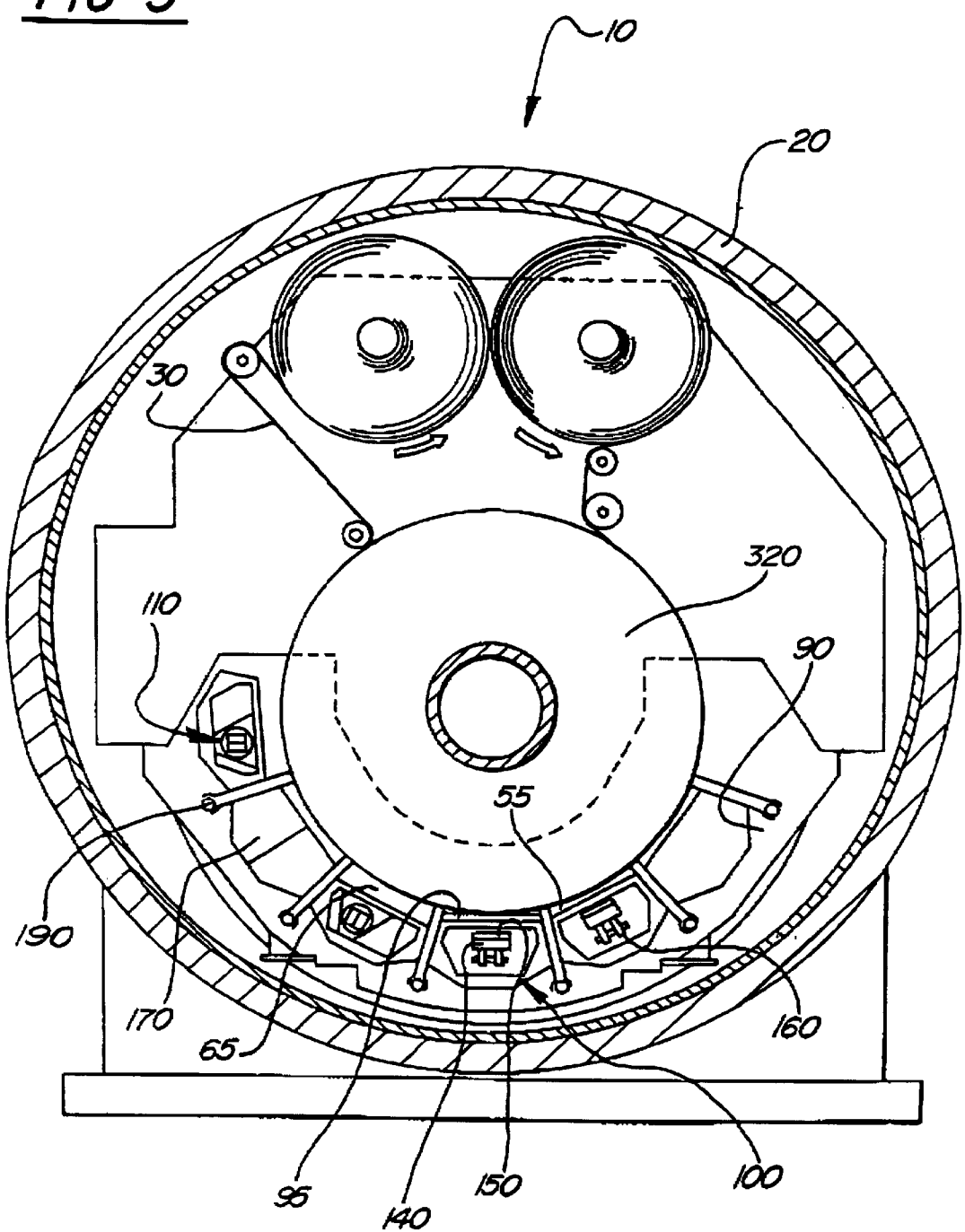
FIG. 3 is a cross-sectional view of a third embodiment of the apparatus according to the teachings of the present invention employing a plurality of confinement systems with the substrate following an arcuate path adjacent to the plurality of confinement systems and in contact with a chill wheel.

Referring now to FIG. 3, a schematic cross-sectional view of a third embodiment of the present invention is shown. In the present embodiment, the substrate 30 is drawn from a payoff reel 310 and through the deposition chamber 20 by a take-up reel 330. A chill roller 320 is disposed within the deposition chamber 20 in the instant embodiment of the present invention. A plurality of guide rollers 340 are disposed within the vacuum deposition chamber 20 to guide the web of substrate material and take up any slack or relieve stress upon the substrate material 30 as the substrate material 30 passes through the vacuum deposition chamber 20.

After the substrate 30 has traveled past the PVD region 55, the substrate 30 continues to travel through the deposition chamber 20 to the CVD region 65 where a CVD process deposits thin film materials onto the substrate 30. FIG. 3 shows the apparatus 10 of the present invention having two confinement chambers 90, each having a sputtering device 100 disposed therein, and two other confinement chambers 90, each having a microwave enhanced chemical vapor deposition ("MPECVD") device 110 disposed therein.

Referring now to FIG. 4, a cross-sectional view of a confinement chamber 90 containing a sputtering device 100 is shown. The sputtering device 100 includes target 150 attached to a cathode 140. The target 150 is actually the source of the material to be deposited, for example ITO. A plurality of magnets 160 are disposed within the deposition chamber 20 and proximal to the cathode 140. Although the presence of the magnets 160 in this particular embodiment of the present invention reveals this is a magnetron sputtering device, it should be noted that any method known in the art for a subatmospheric pressure PVD process may be employed in the instant invention. A reaction gas inlet manifold 120 is adapted to provide reaction gas within the confinement chamber 90 containing the PVD region. One or more reaction gas exhaust manifolds 130 are provided to be in communication with one of the plurality of confinement chambers 90.

A reaction gas, for example argon, is introduced to the confinement chamber 90 by the reaction gas inlet manifold 120. A steady flow of the reaction gas is provided to maintain stoichiometry during the sputtering process. Referring now also to FIG. 3, the cathode 140 has a negative electrical charge which may be in the form of a DC current or high frequency alternating current, also known as R.F. By the addition of a magnetic field, an increase in the traveled path of electrons within the plasma is achieved in order to sustain a plasma charge. Low pressure sputtering devices typically employ a magnetic field because the particle density within the plasma region is very low, i.e. in the millitorr regime. Otherwise, electrons which leave the cathode 140 may strike the chamber 20 walls or any other surface and discharge resulting in a lack of efficiency and ultimately, plasma failure. The magnetic field forces the electrons to travel in a spiral path thereby magnetically confining the electrons. The deposition chamber 20 may have a positive electrical bias. Once an electron strikes a reaction gas atom, an electron will be stripped, and a positive charge on the reaction gas atom will result, and is consequently propelled toward a negatively charged surface, a negatively charged target 150 for example. A collision with the target 150 will cause a small portion of the target material 150 to be dislocated and deposited upon the substrate 30. Argon gas is commonly used as a reaction gas for sputtering, however, one skilled in the art would recognize that other reaction gases may be substituted.

Referring now also to FIG. 1, the pressure within the confinement chamber 90 at least partially defining the PVD region 55 has a pressure between about 1 millitorr and 10 millitorr, preferably operating at a pressure between 2 and 3 millitorr. The pressure within the confinement chamber 90, at least partially defining the PVD region 55, is achieved by employing a vacuum source in communication with the reaction gas exhaust manifold 130. As few as one vacuum source may be employed to achieve the desired pressures throughout the chamber 20. The vacuum source utilized in the preferred embodiment of present invention is driven by one or more diffusion pumps, however, one skilled in the art would immediately recognize that suitable substitutes for diffusion pumps may be employed.

Referring now to FIG. 5, a cross-sectional view of another confinement chamber 90, at least partially defining a CVD region 65, is shown. In the present embodiment, the CVD device 60 is disposed within the confinement chamber 90 at least partially defining the CVD region 65. The CVD device 60 includes a linear microwave applicator 250, which is disposed within a confinement chamber 90. A feedstock gas inlet manifold 180 may be disposed within the confinement chamber 90, or, alternatively the feed stock gas inlet manifold 180 may be physically located outside of, but in communication with the confinement chamber 90 at least partially defining the CVD region 65. An example of an excellent linear microwave applicator may be found in commonly assigned U.S. Pat. No. 5,411,591 to Izu, et al for "APPARATUS FOR THE SIMULTANEOUS MICROWAVE DEPOSITION OF THIN FILMS IN MULTIPLE DISCRETE ZONES," incorporated herein by reference. Although a plasma enhanced chemical vapor deposition device is disclosed in the immediate example, it should become readily apparent to one skilled in the art that any chemical vapor deposition process capable of operating at the pressures disclosed herein would be a suitable substitute. The MPECVD device disclosed herein operates between about 1 to 10 millitorr, and preferably, between 5 to 10 millitorr. The mass flow rate of feedstock gases and the capacity of the vacuum source primarily dictate the pressure within the confinement chamber 90 partially defining the CVD region.

Referring now also to FIG. 3, in one embodiment of the present invention, the chamber 20 has a background pressure, that is a pressure within the chamber 20 not occupied by the CVD region 65 or PVD region 55, below that of either the CVD region 65 or PVD region 55 in order to prevent cross contamination. In the event species should escape from either the PVD region 55 or CVD region 65, the species will be drawn to an area within the chamber 20 not occupied by the CVD region 65 or PVD region 55. By employing a flow restriction device such as chevron, gas flow may be selectively restricted to achieve the desired pressures with as few as one vacuum source. In another embodiment of the present invention, one vacuum source may be assigned to facilitate each of the chamber background pressure, the PVD region 55 pressure, and the CVD region 65 pressure.

Referring again now to FIG. 5, the feedstock gas inlet manifold 180 provides the feedstock gases which are the reactants for the CVD process. The feedstock gases are optimized to provide the correct composition of the desired deposition material. For example, if silicon dioxide is desired, a mixture of about 200 sccm $SiH_4$ (silane), 600 sccm $O_2$ and 150 sccm Ar is introduced into the CVD region 65. This oxygen-rich mixture is so provided in order to maximize the reaction of silane, resulting in a higher percentage of silicon dioxide deposition and a lower presence of Si-H bonds in the deposited films. The deposition rate in a CVD process is limited only by the mass flow rate of the feedstock gases provided to the CVD region. In order to capitalize on the advantages of low pressure CVD, the pressure within the confinement chamber 90 must be maintained below about 10 millitorr. The limitation on the deposition rate of low pressure CVD processes such as MPECVD is limited by the throughput of the vacuum source.

The microwave device 110 radiates microwave energy into the feedstock gas stream provided by the feedstock gas inlet manifold 180. As the feedstock gases are radiated with microwave energy, a plasma is formed within the CVD region 65, causing the feedstock gases to react and form the material to be deposited upon the substrate 30. A plasma sustaining gas, such as argon, may be used to assist in the maintenance of the plasma. As the precursor gases flow through the CVD region 65, the non-deposited species and any plasma sustaining gas is drawn out of the CVD region 65 by the feed stock gas exhaust manifold 190. Referring also now to FIG. 3, a pump out region 170 may be disposed within the deposition chamber 20 along the path of the substrate 30. In the instant embodiment, the pump out region 170 comprises a vacant confinement chamber 90. The pump-out region 170 may be disposed adjacent to the CVD region 65 and employed to be a common collector of non-deposited species and any plasma sustaining gas. A feedstock gas exhaust manifold 190 is shown in communication with the pump-out region 170, so as to form a conduit between the pump-out region 170 and a vacuum source. One skilled in the art would immediately recognize the feedstock gas exhaust manifold 190 may be disposed within or adjacent to the confinement chamber 90 containing the CVD region 65 without including pumpout region 170.

Figure 6:
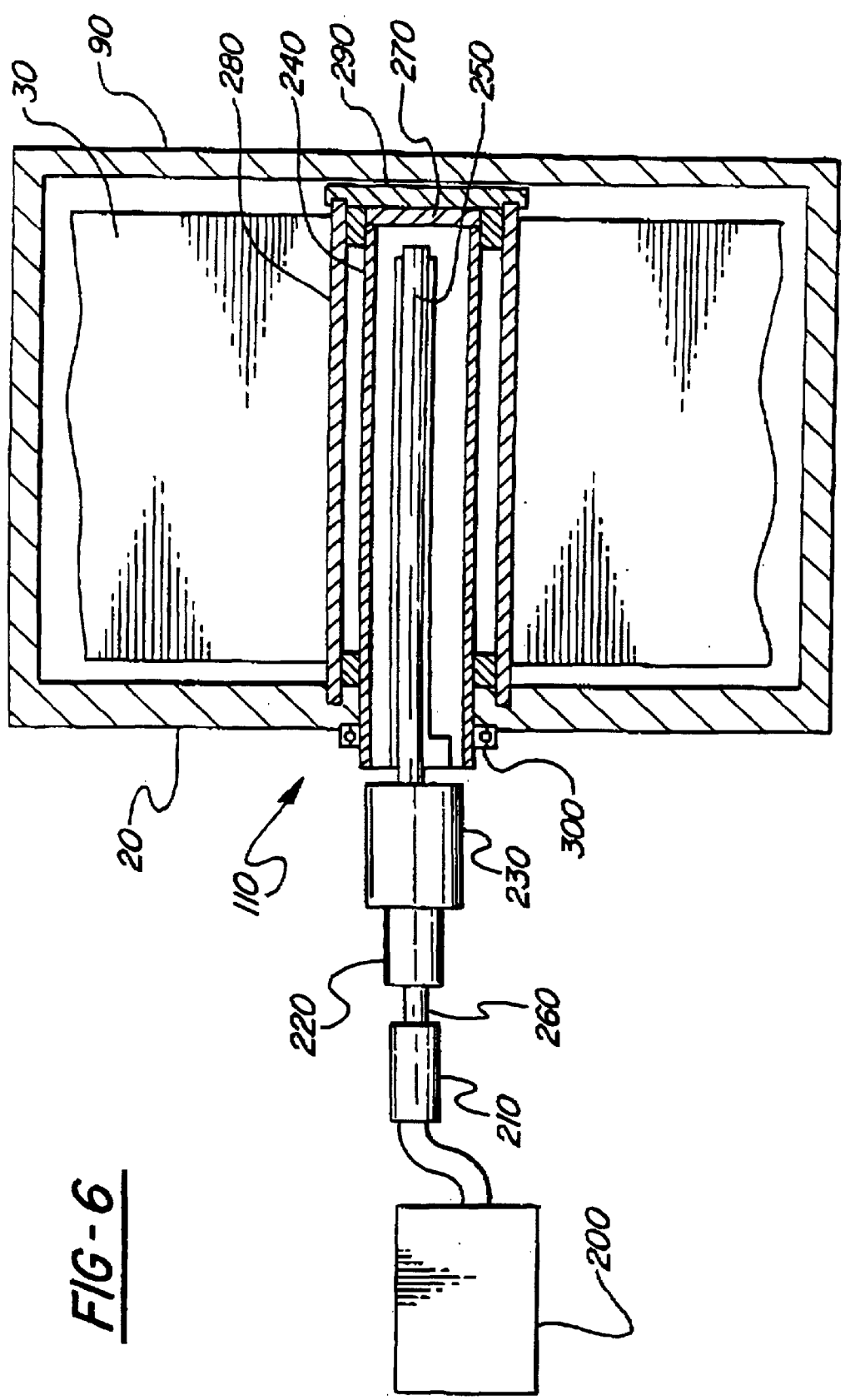
FIG. 6 is an illustration of an embodiment of a microwave enhanced chemical vapor deposition system of the instant invention with the substrate operatively located within the vacuum deposition chamber, and disclosing operative elements including: a power supply, microwave source, three port isolator, tuner, linear microwave applicator and a microwave isolation enclosure.

Referring now to FIG. 6, an illustration of an embodiment of a microwave enhanced chemical vapor deposition device 110 is shown. The microwave device 110 includes a power supply 200 which is coupled to a microwave source 210 by any method known in the art in order to provide a source of electrical power to the microwave source 210. The microwave source 210 may be a magnetron head which is commonly known in the art. One variety of a magnetron head utilizes a filament charged with a very high voltage (at least 1 kV) disposed in the center of a thick walled vacuum chamber. The vacuum chamber of the magnetron head has a magnetic field applied so that the field lines run parallel to the long axis of the vacuum chamber and also parallel to the charged filament. The magnetic field causes electrons from the filament to begin to orbit the filament, tangential to the interior chamber wall which is cylindrical in shape. A plurality of cavities are in communication with the magnetron chamber housing the filament. The cavities have their own frequency and rhythm, causing the electrons to bunch near each cavity as they orbit the filament within the magnetron chamber. The electrons continue to cycle within the magnetron chamber until they reach an operating frequency of about 2.45 gigahertz. An antennae disposed in one of the cavities is affected by the cycling electrons and is adapted to transmit high frequency electrical energy toward a target Microwaves are emitted from the antennae into a wave guide 260 which guides the microwaves through a three port isolator 220 and then to a tuner 230. The three port isolator 220 restricts microwave travel to a single direction. Any microwaves which are reflected back toward the three port isolator 220 are redirected by the three port isolator 220, for example to a water load. The tuner 230 is a load matching device adapted to reduce reflected power. The microwaves continue to travel through the wave guide 260 and into a linear microwave applicator 250 which evenly distributes the microwave energy into the CVD region. The linear microwave applicator 250 may be a separate component from the wave guide 260, or the wave guide 260 and linear applicator 250 may be an integrated component.

Referring now also to FIG. 7, an isometric view of an embodiment of the linear microwave applicator 250 is shown. The applicator 250 is a generally rectangular shaped channel having a plurality of apertures disposed along one side. FIG. 7 discloses the linear applicator 250 having a first end 251, a second end 252, and a series of apertures 253 through 258 spaced about 1 wavelength apart with respect to each aperture's 253 through 258 center. The microwave energy enters at the first end 251 adjacent to aperture 253. The microwave energy "leaks" from the linear applicator through apertures 253 through 258.

As the microwave energy leaks, the microwave power within the applicator is decreased in intensity. For example, if 16% of the microwave energy were permitted to leak from aperture 253, the power of the microwave signal would be reduced to 84% of the original power. By permitting the microwave energy to leak in a substantially uniform manner, a uniform plasma may be created within CVD region 65. It should be noted that although the embodiment of linear applicator 250 discloses six apertures, 253 through 258, as substantially rectangular, it should be noted that various and variable aperture geometries may be employed to achieve a uniform microwave field within the CVD region 65. It should also be noted that adjustment of the leak of apertures 253 through 258 is strictly empirical and that tuning is required in order to achieve a uniform microwave field within the CVD region 65. It should further be noted that although six apertures have been disclosed in this embodiment of the present invention as in FIG. 7, any suitable number of apertures may be employed to achieve the desired result.

The plurality of apertures 253 through 258 are spaced at approximately 1 wavelength apart in order to prevent adjacent microwave fields from canceling one another. The microwave device 110 is designed to provide a traveling wave, so as to avoid problems that accompany a standing wave. The plasma may be stabilized through empirical methods only. The state of the art does not provide adequate information that would enable those skilled in the art to model the present relationship involving this phase dependent absorption.

Returning now to FIG. 6, the microwave device 110 further includes a microwave applicator enclosure 240 which prevents particles within the CVD region 65 from contaminating the linear applicator 250. The microwave applicator enclosure 240 is preferably fabricated from a dielectric material which is substantially transparent to microwave energy. A preferred material is quartz, however, it should be apparent to those skilled in the art that other suitable materials may be substituted for quartz. The microwave applicator enclosure 240 may have one open end whereby the linear applicator 250 is inserted into the microwave applicator enclosure 240. The enclosure 240 is typically, but not necessarily, at about atmospheric pressure. Also, the applicator enclosure 240 may be cooled by a liquid or any other suitable cooling means known in the art. Additionally, the microwave applicator enclosure 240 may have a second open end and protrude through the vacuum deposition chamber 20 at both ends. For strength purposes, the microwave applicator enclosure 240 should have a generally cylindrical, or generally curved shape. The microwave applicator enclosure 240 may be sealed at one end with an end cap 270 formed of the same material as the microwave isolation enclosure 240 and may be securely attached to the vacuum deposition chamber 20 by a retaining cap 290 and retaining rods 280. If desired, the microwave applicator enclosure 240 may also take the form of a test tube, eliminating the end cap 270. One or more seals 300 may be employed to prevent air leakage where the microwave applicator enclosure 240 penetrates the vacuum deposition chamber 20.

Referring now again to FIG. 5 and FIG. 3, as previously mentioned, the microwave energy from the microwave device 110 causes the feedstock gases to react and form the products which are deposited upon the substrate 30. The microwave energy provides a high density of free radicals, compared to the more conventional density generated by R.F., which results in higher deposition rates and nearly 100% utilization of the feedstock gases. Additionally, the low pressures create a longer mean free path of travel for the excited species, contributing to overall plasma uniformity. Another benefit to operating at subatmospheric pressures is the quality of the materials which are deposited. Operation in low pressure regimes eliminates powder and polymeric formations in the plasma while providing the most economic mode of plasma deposition.

Each deposition region within deposition chamber 20 is isolated by a confinement system. In a pressure regime of about 1 millitorr to 10 millitorr, the behavior of gas molecules falls between laminar flow and molecular flow. Laminar flow is characterized by a Newtonian response of the fluid to some force. That is, the gas molecules acting in concert are compressible, have a density, viscosity, and when in motion are characterized by a boundary layer flow field. In a molecular regime, gas molecules move independently within a volume; a change in motion, or vector, is a result of a collision. In the molecular regime, a gas molecule will continue in motion until the molecule strikes some surface or another gas molecule, whereby the trajectory of the gas molecule is altered.

The transition regime between molecular flow and laminar flow is known as the Knudsen regime, characterized by a hybrid behavior consisting of qualities of both molecular and Newtonian flow. The mass flow rate for a Knudsen regime gas is described by the equation F=C$\Delta$P where F is the mass flow rate of the gas, C is conductance and $\Delta$P is a pressure drop across some restriction from pressure P1 to pressure P2, where $\Delta$P is the difference of P1 and P2. By operating in the Knudsen gas regime, the best of both worlds is available in that a plasma may be sustained within this pressure while the gas exhibits molecular behavior.

In the preferred embodiment, each one of the confinement chambers 90 have at least one aperture 95. The substrate 30 is in close proximity to the aperture 95 of each confinement chambers 90 at least partially defining a PVD region 55 or a CVD region 65. The substrate 30 being in close proximity to the aperture 95 of each confinement chamber 90 further defines a PVD region 55 and/or a CVD region 65.

Known in the art are various methods for confining species within a region. A gap between substrate 30 and confinement chamber 90 is provided so as to be large enough to account for any tolerances that may lead to contact between the confinement chamber 90 and substrate 30. This gap is minimized to confine the matter within each confinement chamber 90 without contacting the substrate 30. In order for the gas molecules to escape from the PVD region 55 or CVD region 65, the gas molecule must be traveling in a path nearly parallel to the substrate 30. Since the gas flow is not introduced along and parallel to the substrate 30 surface, the possibility that a gas molecule will escape in this manner is very close to impossible, this technique is referred to herein as particle vector confinement, and is commonly used in a device know in the art as a chevron. Therefore, any non-deposited species within a PVD region 55 or CVD region 65 will be removed from the confinement chamber 90 by either the reaction gas exhaust manifold 130 in the case of a PVD process or the feedstock gas exhaust manifold 190 in the case of a CVD process. Particle vector confinement prevents potentially hazardous silane molecules from traveling to the PVD region 55 where the silane molecules may react with the target 150 resulting in contamination.

Alternatively, cross contamination may be prevented at pressures above the Knudsen regime by incorporating gas gate confinement. By taking advantage of a fluids Newtonian behavior, non-deposited species may be confined by flowing a gas, an inert gas is typical, but not always necessary, between two deposition regions. One method of gas gate confinement is disclosed in commonly assigned U.S. Pat. No. 4,462,333 to Nath, et al for "PROCESS GAS INTRODUCTION, CONFINEMENT AND EVACUATION SYSTEM FOR GLOW DISCHARGE DEPOSITION APPARATUS", the disclosure of which is incorporated by reference herein. The gas may flow between two PVD regions 55, two CVD regions 65, or any combination thereof. By introducing gas at a higher pressure, or by creating a pressure drop, the particle flow within a PVD region 55 or a CVD region 65 may be governed.

The present invention contemplates that it may be necessary to confine as few as one deposition region. In the event non-deposited species from one deposition region are benign to any other deposition regions within the deposition chamber 20, confinement would not be required. Each deposition region may be isolated by providing a confinement system. Therefore, each of at least two different processes selected from the group consisting of a PVD process and a CVD process may provide thin film deposition within the same chamber 20 without being subject to cross contamination.

A widened microwave plasma enhanced chemical vapor deposition ("WMPECVD") device 400, as illustrated in FIG. 8, may be substituted for MPECVD device 110 in order to increase the desired width of deposition of a chemical vapor deposition process. The WMPECVD device 400 includes a microwave applicator enclosure 410 and a widened microwave linear applicator 420. Referring now also to FIG. 9, the widened microwave linear applicator 420 has a first end 421 and a second end 422. A first applicator half 430 and a second applicator half 440 are in close proximity to form the widened applicator 420. The first applicator half 430 has a first end 431 and a second end 432, and a plurality of apertures 433 through 438 disposed therein. Similarly, the second applicator half 440 has a first end 441 and a second end 442, and a plurality of apertures 443 through 448 disposed therein.

It should be noted that although the embodiment of the widened linear applicator 420 discloses six apertures in each of first applicator half 430 and second applicator half 440, as substantially rectangular, it should be noted that various and variable aperture geometries may be employed to achieve a uniform microwave field. It should also be noted that adjustment of the leak of apertures 433 through 438, and 443 through 448, is strictly empirical and that tuning will be required in order to achieve a uniform microwave field within the CVD region 65. It should further be noted that although six apertures have been disclosed in each of first applicator half 430 and second applicator half 440 in this embodiment of the present invention as in FIG. 9, any suitable number of apertures may be employed to achieve the desired result.

The second end 432 of the first applicator half 430 is adjacent to the second end 442 of the second applicator half 440. The widened microwave linear applicator 420 is disposed within the microwave applicator enclosure 410 to prevent particles from contacting the widened microwave linear applicator 420.

The WMPECVD device 400 further includes a first wave guide 450 and a second wave guide 460. The first wave guide 450 is in communication with the first end 431 of the first applicator half 430, the second wave guide 460 is in communication with the first end 441 of the second applicator half 440. A microwave source 470 is in communication with the first wave guide 450 and second wave guide 460, whereby microwave energy produced by the microwave source 470 is guided to the first applicator half 430 and second applicator half 440. At least one aperture is disposed within a side of each of the first applicator half 430 and second applicator half 440, which allows microwave energy provided by the microwave source 470 to penetrate the CVD region 65. Each of the first applicator half 430 and second applicator half 440 may be a separate component from the first wave guide 450 and second wave guide 460, respectively, or integrated components.

A power supply 500 is suitably coupled to the microwave source 470 by any method known in the art. An example of a microwave source is a magnetron head, as disclosed above. The microwave source 470 may be coupled to a microwave splitter 540 in order to distribute microwave energy emitted from the microwave source 470. By distributing the microwave energy from the microwave source 470, only one microwave source 470 needs to be provided. Alternatively, two microwave sources (not shown), each of which may be in communication with one of the first and second wave guide, 450 and 460 respectively, without incorporating the splitter 540 in order to accomplish the same result.

At least one shorting screw 530 may be disposed between the first applicator half 430 and the second applicator half 440 so as to prevent microwave energy from traveling from the first applicator half 430 to the second applicator half 440 and alternatively to prevent microwave energy from the second applicator half 440 to travel to the first applicator half 430. Shorting screw 530 provides a shield to, and directs excess microwave energy away from the microwave source 470 and widened linear applicator 420. The first waveguide 450 may be in communication with a first tuner 550 and the second waveguide 460 may be in communication with a second tuner 560. A first three port isolator 510 and second three port isolator 520 may be in communication with the splitter 540. First and second three port isolator 510, 520 function in a manner similar to three port isolator 220 disclosed above. Three port isolator 510 may be in communication with a first tuner 550 and second three port isolator 520 may be in communication with the second tuner 560. The tuners 550, 560 control the amount of power provided for chemical vapor deposition.

The widened microwave device 400 of the present invention provides a solution to shorting problems which have been experienced when attempting to deposit material upon a substrate that is 1 meter or wider. In order to provide the required amount of microwave energy to the widened microwave linear applicator 420, convention dictates the apertures disposed within the linear applicator must become very narrow. A narrow aperture in a linear applicator is commonly susceptible to shorting problems rendering the device impractical. However, this obstacle has been overcome by the widened microwave applicator 420 of the present invention. Applying the teachings the widened microwave applicator 420 of the present invention, a linear applicator of up to about 120 centimeters long or longer may be achieved.

As shown in FIG. 9, the first applicator half 430 and second applicator half 440 are disclosed in an isometric view. The first applicator half 430 is essentially a mirror image of the second applicator half 440. Apertures 433 through 438 ascend in size with respect to the first applicator half 430, and apertures 443 through 448 descend in size regarding the second applicator half 440. Therefore, it is possible to create a uniform plasma while avoiding unwanted arcing by providing microwave energy at each of the first end 421 and the second end 422 of the widened microwave applicator 420.

An interferometer stack may be fabricated by applying the teachings set forth herein. A stack having at least two layers may be fabricated, wherein each of at least two layers are formed by a different deposition process selected from PVD means and/or CVD means. As set forth above, the processes that are included under the group referred to as PVD processes and CVD processes, not intending to be exclusive, PVD processes include: D.C. sputtering, D.C. magnetron sputtering, R.F. sputtering, R.F. magnetron sputtering, reactive sputtering, evaporative deposition, reactive evaporative deposition, and plasma arc deposition; and CVD processes include: thermal CVD, hot wire CVD, plasma enhanced chemical vapor deposition ("PECVD"), microwave plasma enhanced chemical vapor deposition ("MPECVD"), D.C. PECVD ("DCPECVD"), R.F. PECVD ("RFPECVD"), widened MPECVD ("WMPECVD"), and electron cyclotron resonance ("ECR").

By providing the PVD means and/or CVD means within the deposition chamber while preventing cross contamination when necessary, a stack having at least two layers may be fabricated, where at least two different processes provide material to be deposited upon the substrate. The deposition chamber is evacuated to a subatmospheric pressure. A substrate is provided to receive materials thereon. PVD means and/or CVD means are provided within the deposition chamber.

A first process is provided which has been selected from the group consisting of PVD means and/or CVD means. A layer of material provided by the first process is deposited onto the substrate. A second different process is provided which has been selected from the group consisting of PVD means and/or CVD means. Another layer of material is then deposited upon the substrate.

EXAMPLE

The first step in fabricating an interferometer stack is to provide a substrate for receiving deposition thin film materials. A roll of substrate material is provided on a pay-off reel disposed within the deposition chamber of the apparatus of the present invention. The substrate is wound through the deposition chamber, guided by a plurality of guide rollers, to a take-up reel provided within the deposition chamber. The substrate is in contact with a chill wheel to cool the substrate, as the processes operating within the deposition chamber create a significant amount of heat. The substrate passes by a plurality of glow bars as the substrate is drawn off of the pay-off reel toward the first deposition station. The glow bars prepare the substrate to assist in adhesion of material that will be deposited.

The substrate is then drawn toward the first deposition station to receive a first layer of material. For purposes of this example, a 200 Å layer of ITO is provided by PVD means, specifically a sputtering process provides the thin film materials to be deposited upon the substrate. Material provided by the sputtering process is confined within a deposition region adjacent to the first deposition station. For purposes of this example, the substrate is continuously moving, although one skilled in the art would immediately recognize that the teachings of the present disclosure are not bound to a continuously moving substrate.

One advantage of the present invention is that the material which is required for the stack design is provided without being exposed to external influences. In the instant example, the background gas within the deposition chamber is argon. If the substrate was removed from the deposition chamber after the first layer of Si was deposited, then the layer would be exposed to oxygen and other external influences. Oxidation would be apparent upon the surface of the Si layer. By depositing the entire stack within a deposition chamber, material properties are maintained and impurities that may otherwise form on the exposed surface of the various deposited layers are prevented.

The portion of substrate having received the first layer is then drawn to a second deposition station, where a second layer is provided upon the substrate by either PVD means, or CVD means. In this example, a 200 Å layer of $SiO_x$ is provided by PVD means, specifically a sputtering process. The material provided by the sputtering process is confined within a deposition region located adjacent to the second deposition station. The portion of substrate having received the second layer is then drawn to a third deposition station, where an 800 Å layer of ITO is provided by a sputtering process. Non-deposited species provided by the sputtering process are confined within the deposition region as with the first and second layers.

The portion of substrate having received the third layer of material is then drawn to a fourth deposition station, where a 1000 Å layer of $SiO_x$ is provided by CVD means, specifically a MPECVD process. Containment of silane is critical at the fourth deposition station. Otherwise, silane molecules coming into contact with the ITO sputtering target would contaminate the ITO target.

The substrate having received all of the layers required for the stack design, is then drawn toward the take-up reel. The roll of completed material is removed from the apparatus and prepared for shipping.

Selective solar radiation control coatings can be used to address the full potential market for SSRC coated glass, especially in southern climates. The instant coatings are made practical by low pressure, high deposition rate microwave plasma enhanced chemical vapor deposition (PECVD) processes which are more economical than PVD process as disclosed above. SSRC coatings, using only moisture resistant dielectric and/or semiconductor coatings are deposited in layers upon whatever optical substrate is desired, typically glass or polymer, to form a type of interferometer stack known as an optical stack. The optical stack is designed to absorb as much UV radiation as possible, reflect as much near IR radiation as possible and transmit as much visible light as possible.

One particularly good combination of materials for production of an optical stack is a $Si_3N_4$ (silicon nitride) dielectric and an amorphous silicon semiconductor with added carbon to increase the band gap, SiC (silicon carbide). Unfortunately, the state of the prior art does not provide a high speed, low cost method for production of such an optical stack over a wide area, such as a window for commercial building. The prior art provides a sputtering process at a rate of 10 angstroms per second for silicon nitride and less than 5 angstroms per second for silicon carbide. This would require a sputtering machine approximately in order of magnitude longer, and thus the process would be more expensive than to provide ZnO/Ag coatings. However, the widened MPECVD device disclosed herein makes these coatings economical.

Of great importance is the fact that these SSRC coatings contain no moisture sensitive dielectrics (such as ZnO) or free metals which are susceptible to oxidation (such as silver). Consequently, these coatings do not need to be placed in an inert gap of insulating glass unit.

In northern climates, the optimal SSRC device would have different properties in the winter than in the summer. In these climates, it is desirable to reflect (or absorb) the UV and reflect the far IR in both the winter and the summer. However, in the winter it is desirable to transmit the near IR to reduce heating costs. While in the summer, it is desirable to reflect the near IR to reduce cooling costs. The durability and low costs of these SSRC stacks would enable the design of windows wear as coating mounted on a clear, flexible plastic substrate. It could take the form of a window or a shade or blind.

The band gap of a dielectric or semiconductor is the amount of energy required for an electron to transit from the valance band to the conduction band. The significance of the band gap in selective solar radiation control coatings is the correlation between wave length and energy, expressed in electron volts of light. For example, the center frequency of visible light has a wave length of approximately 5500 angstroms, which is equivalent to 2.2 electron volts. The band gap of a dielectric or semiconductor will determine whether a given frequency of light will be absorbed. The energy of light at a particular frequency is commonly referred to as the photon energy. A photon energy greater than the band gap energy wilt result in absorption. Therefore, it is necessary to express materials in relation to their and gap.

One embodiment of a selective solar radiation control coating of the Instant invention is one formed from a silicon carbide layer disposed between a first and second silicon nitride layer. The silicon carbide layer has a band gap of about 2.0 eV or higher and is between about 500 and 700 angstroms thick. This silicon carbide layer absorbs essentially all of the UV radiation. The first and second silicon nitride layers each have a refractive index of about 1.9 or higher and are between about 100 and 300 and 300 and 500 angstroms thick, respectively.

This silicon nitride/silicon carbide SSRC coating absorbs nearly all of the UV, reflects about 40% of the IR, and transmits over 86% of the visible light. The transmission peak is centered around the center of the spectrum to which the human eye is sensitive; consequently, making the coating appear colorless. The thickness of the coatings and the band gap of the SiC coating can be adjusted to fine tune the position and shape of the transmission curve, which adjusts the coating for color neutrality.

Another embodiment of a selective solar radiation control coating of the instant invention is one formed from a silicon carbide layer disposed between the first and second diamond-like carbon layer. The silicon carbide layer has a band gap of about 2.0 eV or higher and is between about 300 and 450 angstroms thick. The first and second diamond-like carbon layers each have a refractive index of about 2.3 or higher and are between about 200 and 350, and about 400 and 500 angstroms thick, respectively.

This diamond-like/silicon carbide SSRC coating absorbs nearly all of the UV, reflects about 40% of the IR and transmits about 94% of the visible light. The transmission peak is centered around a portion of the spectrum to which the human eye is sensitive, consequently, making the coating appear colorless. The thickness of the coatings and the band gap of the SiC coating can be adjusted to fine tune the position and shape of the transmission curve, which adjusts the coating for color neutrality.

Yet another embodiment of a selective solar radiation control coating of the instant invention is one formed from one or more dual layered coatings of silicon oxide and silicon nitride deposited upon the substrate. The silicon nitride layer is deposited adjacent to the substrate and if more than one dual layer coating is applied, the silicon oxide and silicon nitride alternate. The silicon oxide layers have a refractive index of about 1.48 and are typically between about 1100 and 1900 angstroms thick, and the silicon nitride layers have a refractive index of about 1.97 and are typically between about 1000 and 1500 angstroms thick.

These dual layered silicon oxide/silicon nitride SSRC coatings absorb nearly all of the UV, reflects about 21% of the IR for one dual layer, 45% of the IR for two dual ayers and 63% of the IR for three dual layers and transmit about 94% to 95% of the visible light. The transmission peak is centered around the portion of the spectrum to which the human eye is sensitive; consequently, making the coating appear colorless.

These coatings are useful for forming coated optical articles which include an optical substrate having at least one surface and at least one selective solar radiation control coating deposited onto the optical substrate. The optical substrate may be glass or plastic.

Yet another embodiment of a selective solar radiation control coating of the instant invention is one formed from one or more dual layered coatings of silicon oxide and titanium oxide deposited upon the substrate. The titanium oxide layer is deposited adjacent to the substrate and if more than one dual layer coating is applied, the silicon oxide and titanium oxide layers alternate. The silicon oxide layers have a refractive index of about 1.45 and are typically between about 250 and 1260 angstroms thick, and the titanium oxide layers have a refractive index of about 2.30 and are typically between about 400 and 1160 angstroms thick.

Some dielectric materials useful for the SSRC coatings of the instant invention are silicon nitride, silicon oxide, titanium oxide, silicon oxynitride, alloys of these materials with carbon and diamond-like carbon. Additionally, while silicon carbide has been disclosed as a semiconductor material, other materials such as silicon, doped silicon, germanium, doped germanium and germanium carbide are useful semiconductors.

While the invention has been described in connection with preferred embodiments and procedures, it should be understood that it is not intended to limit the invention to the described embodiment and procedures. On the contrary, it is intended to cover all alternatives, modifications and equivalents which may be included within the spirit and scope of the invention as defined by the claims of appended hereto.

What is claimed is:

1. In a microwave deposition device of the type having an applicator for producing a plasma and at least one microwave source in communication with the applicator for providing microwaves thereto, the improvement characterized by:

the applicator comprising a first portion for receiving and transmitting microwaves and a second portion for receiving and transmitting microwaves, wherein microwaves entering the first portion are prevented from entering the second portion and microwaves entering the second portion are prevented from entering the first portion.

2. The microwave deposition device of claim 1 wherein the first portion and the second portion each have a plurality of apertures for radiating microwaves, the apertures ascending in size along each corresponding portion.

3. The microwave deposition device of claim 1 wherein the microwave source is a single microwave source in communication with both the first portion and the second portion.

4. The microwave deposition device of claim 1 wherein the first portion and second portion are mirror images of each other.

5. The microwave deposition device of claim 1 wherein the first portion and the second portion have opposed ends for receiving microwaves.

6. The microwave deposition device of claim 1 wherein the first portion and second portions are separated by a shield.

7. The microwave deposition device of claim 1 wherein the applicator is at least 120 centimeters long.

8. In a microwave deposition device of the type having a microwave source and an applicator, the improvement characterized the applicator comprising:

a first portion and a second portion in close proximity to one another, each of said portions adapted to receive and transmit microwaves, each portion having an independent input for microwaves, wherein microwaves entering the first and second portions are prevented from traveling into the other of the first and second portions.

9. The microwave deposition device of claim 8 wherein the first portion and the second portion each have a plurality of apertures for radiating microwaves to form a plasma, the apertures of each portion ascending in size along each corresponding portion.

10. The microwave deposition device of claim 8 wherein the first portion and the second portion each have a length greater than a width and are disposed end to end with opposed ends for receiving microwaves.

* * * * *